United States Patent [19]

Karlow et al.

[11] 4,441,086
[45] Apr. 3, 1984

[54] AUDIO SYSTEM WITH ORDERLY SHUTDOWN SEQUENCE

[75] Inventors: James P. Karlow, Noblesville; Gary A. Hunt, Kokomo, both of Ind.

[73] Assignee: General Motors Corporation, Detroit, Mich.

[21] Appl. No.: 377,828

[22] Filed: May 13, 1982

[51] Int. Cl.³ .............................................. H03F 1/26
[52] U.S. Cl. ................................. 330/297; 330/128; 330/295; 381/86; 381/94; 381/120; 455/297
[58] Field of Search ................ 330/51, 128, 148, 202, 330/295, 297; 455/297; 381/86, 94, 120

[56] References Cited

U.S. PATENT DOCUMENTS 3,840,820 10/1974 Kawada ............................ 330/51 X
3,916,321 10/1975 Morse ............................. 330/284 X
4,127,743 11/1978 Ozawa et al. .................... 330/51 X Primary Examiner—James B. Mullins
Attorney, Agent, or Firm—A. F. Duke

[57] ABSTRACT

An audio system including audio processing circuit means interposed between a source of audio signals and a power amplifier. Power control circuitry including time delay means which respond to an on/off power switch for applying and removing power to the components of the audio system in a sequence which prevents audible pops associated with system start-up and shutdown.

4 Claims, 2 Drawing Figures

AUDIO SYSTEM WITH ORDERLY SHUTDOWN SEQUENCE

FIELD OF THE INVENTION

This invention relates to audio systems and, more particularly, to an audio system that includes a turn-off delay feature which eliminates the audible "pop" which often occurs during system shutdown.

BACKGROUND OF THE INVENTION

During audio system start-up and shutdown, disturbances originating in various parts of the system result in an irritating sound or "pop" emanating from the speakers. A number of proposals for solving this problem have been made in the prior art. It has been proposed to delay the turn-on of the power amplifiers so that such transient disturbancees do not reach the speakers during system start-up. See for example Figure 4.13.27 of the 1980 Audio/Radio Handbook from National Semiconductor Corporation. Ozawa et al U.S. Pat. No. 4,127,743 proposes a relay control switch between the power amplifier and the speaker and control circuitry for delaying closure of this switch when power is applied and to very quickly open the switch when power is removed. Kawada U.S. Pat. No. 3,840,820 provides a muting transistor which shunts the input to the power amplifier to ground for a short time interval when power is applied and removed from the system. Morse U.S. Pat. No. 3,916,321 also employs a transistor for muting the audio signal channel during power-up and power-down of the system.

With the advent of higher performance audio systems for the automobile, there are various advantages to mounting the power amplifiers in the remotely located speaker enclosures. Such power amplifiers usually include muting circuitry which senses the supply voltage in order to mute the power amplifier during start-up and shutdown. While the muting circuitry is effective during start-up, the filter circuitry in the power amplifier prevents the muting circuitry from performing its function for a predetermined time interval after removal of power. This has the salutary effect of preventing inadvertent muting during power supply variations, which are prevalent in automobiles, but does permit noise generated during shutdown of the audio processing circuitry to be heard. In order to eliminate this time interval and activate the mute circuitry immediately upon removal of power, a separate mute wire is required and where several speakers are employed, this results in a cost penalty and a potential reliability problem during vehicle assembly and product service life.

SUMMARY OF THE INVENTION

With the foregoing in mind, it is an object of the present invention to provide an audio system which provides for an orderly shutdown of the system in order to eliminate audible disturbances originating in the audio processing circuitry of the system.

In accordance with the present invention, power to the remote amplifiers is supplied through a power relay controlled by the radio on/off switch. Power to the radio tuner or other source of audio signals, as well as to the audio processing circuitry, is provided through power control circuitry which includes time delay circuitry. The time delay circuitry permits power to be maintained to the audio processing circuitry during the time required for the power amplifier to shutdown following opening of the on/off power switch thereby preventing instabilities in the audio processing circuitry from being conducted to the power amplifiers and speakers. The volume control for the audio processing circuitry is combined with the on/off switch and is at a minimum volume position when the power switch is moved to the off position. Thus, noise which might be generated during shutdown of the source of audio signal is not fed through the still active audio processing circuitry to the power amplifiers.

A more complete understanding of the present invention may be had from the following detailed description which should be read in conjunction with the drawings, in which:

DESCRIPTION OF THE PREFERRED EMBODIMENT

Figure 1:
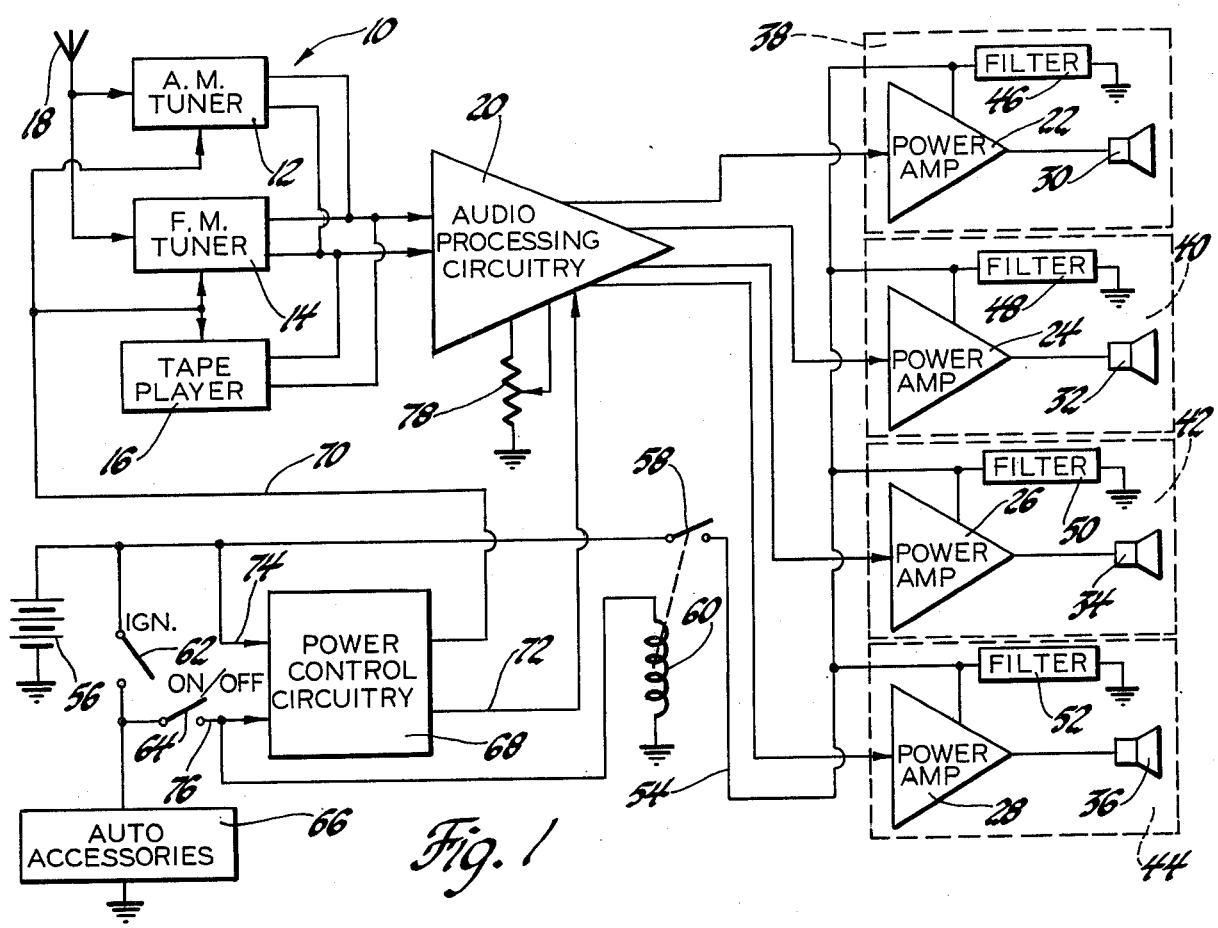
FIG. 1 is a block diagram of a preferred embodiment of the present invention.

Referring now to the drawings and initially to FIG. 1, the audio system of the present invention includes a source of audio signal generally designated 10 which may be an AM tuner 12, a FM tuner 14 or a tape player 16. The AM and FM tuners 12 and 14 receive RF signals from an antenna 18. The raw audio signals from the source 10 are provided to audio processing circuitry generally designated 20. The audio processing circuitry 20 may include noise reduction circuitry, tone, fade, volume and loudness control circuitry, one or more of which may be responsive to manual input controls. The circuitry 20 provides four outputs to individual power amplifiers 22-28 which drive speakers 30-36 located remote from the processing circuitry 20. The amplifiers 22-28 are packaged with the speakers 30-36, respectively, in a tuned and ported enclosure designated 38-44 and, preferably, are designed to compensate for the acoustical deficiencies in the particular car body in which they are to be installed. Each of the power amplifiers 22-28 has associated therewith filter circuitry generally designated 46-52 which include relatively large capacitors for filtering transients on the conductor 54. The conductor 54 is connected with the vehicle battery 56 through the relay contacts 58 of a power relay 60. The relay 60 is energized from the battery 56 through an ignition switch 62 and a radio on/off power switch 64. A plurality of auto accessories generally designated 66 are connected to the battery 56 through the ignition switch 62. Power control circuitry 68 provides power to the audio source 10 through a conductor 70 and to the audio processing circuitry through a conductor 72. The circuitry 68 is connected directly with battery 56 over conductor 74 and to the battery 56 through the switches 62 and 64 over the conductor 76. As is normal with present automobile radios, the volume control potentiometer generally designated 78 is combined with the on/off switch 64 so that in turning the radio off, the volume control is placed in its minimum volume position.

Figure 2:
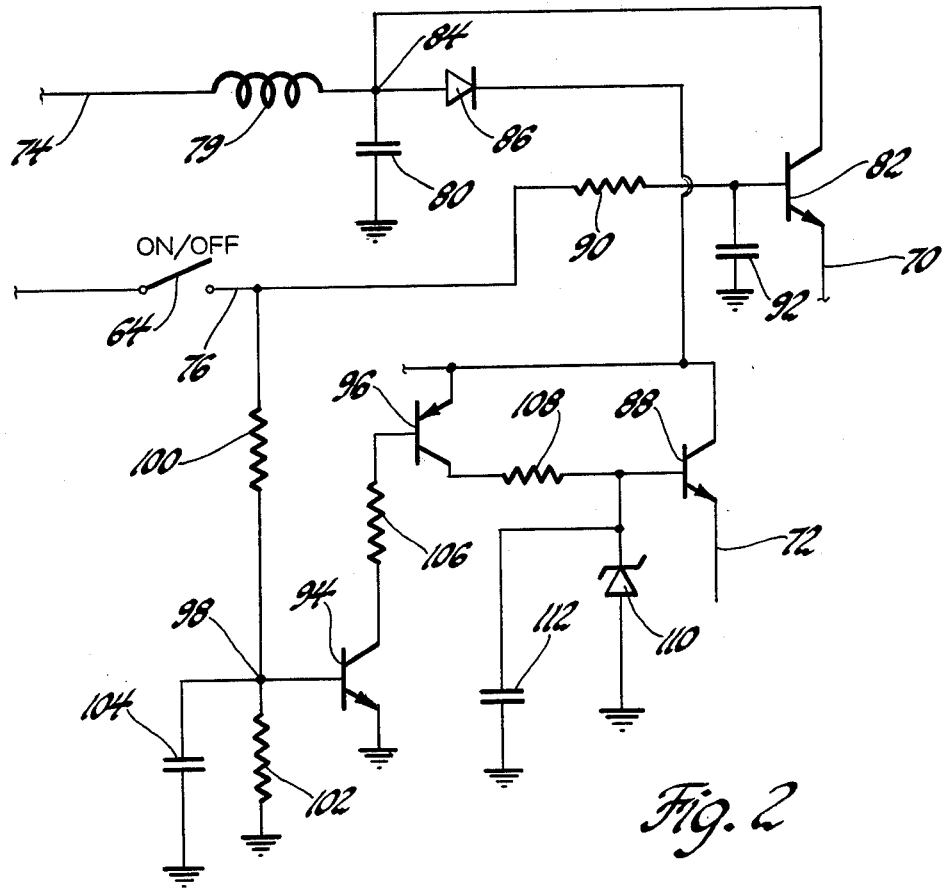
FIG. 2 is a detailed schematic diagram of the power control circuitry of FIG. 1.

Referring now to FIG. 2, the power control circuitry 68 is shown in greater detail. Battery voltage on the conductor 74 passes through an input filter comprising a choke 79 and a capacitor 80. The principle function of this filter is to protect the audio source 10 and the processing circuitry 20 from large DC voltage spikes such as might occur during load dump conditions and to provide high frequency alternator whine filtering. Power is supplied to the audio source 10 through a switching transistor 82 having its collector connected with the junction 84 of the input filter and its emitter connected with the conductor 70. Power for the low level audio processing circuitry 20 is supplied through a reverse voltage protection diode 86 and a switching transistor 88 to the conductor 72. The base of transistor 82 is connected with the on/off switch 64 through a current limiting resistor 90. Capacitor 92 reduces fluctuations in the voltage at the base of transistor 82. Time delay circuitry associated with the transistor 88 is connected with the on/off switch 64 and comprises transistors 94 and 96. The transistor 94 has its base connected to a junction 98 between voltage dividing resistors 100 and 102 connected between the on/off switch 64 and ground. Capacitor 104 is connected in parallel with resistor 102. With the ignition switch on, or in the accessory position (not shown), and the on/off switch 64 closed, the capacitor 104 charges through the resistor 100 and provides base voltage for the transistor 94. When the voltage at the base of transistor 94 reaches 0.6 volts, a relatively short time interval, transistor 94 conducts. Current flow through resistor 106 biases transistor 96 on and current flow through resistor 108 biases transistor 88 on. Zener diode 110 limits the voltage at the base of transistor 88 to a voltage of, for example, 14 volts, while capacitor 112 removes any supply ripples on the base of transistor 88.

During system turn-off, when the radio power switch 64 is rotated to the off position, power is removed from the relay 60 deenergizing it, removing power from the amplifiers 22–28. Shutdown of the amplifiers 22–28 is not immediate, however, due to the large filter capacitors in the filter circuitry 46–52, which during initial stages of discharge allow the amplifiers 22–28, respectively, to remain operational until the amplifiers own mute circuitry senses a low voltage condition and mutes. When the switch 64 is rotated to the off position, current flow ceases through resistor 90 causing Q1 to turn-off immediately removing power from the audio source 10. Battery power to the audio processing circuitry 20, however, remains on even though voltage is removed from resistor 100. Without voltage to maintain charging current to capacitor 104, it discharges to ground through resistor 102, resistor 100 in series with relay coil 60 and the base-emitter path of transistor 94. Resistor 102 is the major determinant of the turn-off delay time constant. Current flow through resistor 100 and relay coil 60 is unsufficient to modify the action of the coil 60. After a predetermined time interval, of for example 2.5 seconds, capacitor 104 will discharge to a point where the base voltage of transistor 94 drops below 0.6 volts and transistor 94 ceases to conduct, causing transistor 96 to shut-off. The voltage at the collector of transistor 96 falls, causing the voltage at the base of transistor 88 to fall. The base current at transistor 88 is such that the stored charge in capacitor 112 is rapidly consumed. Voltage at the emitter of transistor 88 falls shutting down the audio processing circuitry 20. Because the volume control 78 is at minimum with the power switch 64 in the off position, no noise signal is transferred from the already shutdown audio source 10. The audio processing circuitry remains quiet since it is energized until well after the amplifiers 22–28 go into shutdown mute. Thus, the audio processing circuitry 20 shuts down into an already muted power amplifier and, therefore, creates no audible disturbances in the process.

The embodiments of the invention in which an exclusive property or privilege is claimed are defined as follows:

1. An audio system including a source of direct current potential, a manually operable on/off switch, a source of audio signals, power amplifier means, audio processing circuit means connected between said source of audio signals and said power amplifier means, first controlled switching means for connecting said source of direct current potential to said power amplifier means in response to closure of said on/off switch, power control circuit means including second and third controlled switching means for connecting said source of direct current to said source of radio signals and said audio processing circuit means respectively in response to closure of said on/off switch, said power amplifier means including filter means which delay the shutdown of said power amplifier means for a first predetermined time interval following opening of said on/off switch, said third controlled switching means including time delay means for maintaining the connection between said source of direct current potential and said audio processing circuit means for a second predetermined time interval after the opening of said on/off switch, said second predetermined time interval being greater than said first predetermined time interval whereby said power amplifier means is deenergized prior to said audio processing circuit means to eliminate audible disturbances originating as a result of shutdown of said audio processing circuit means.

2. The audio system defined in claim 1, further including volume control means combined with said on/off switch means, said volume control means providing an input signal to said audio processing circuit means, said input signal producing a minimum volume just prior to opening of said on/off switch.

3. The audio system defined in claim 2, further including an ignition switch connected between said source and said on/off switch, said first switching means comprising a relay, said second and third switching means comprising first and second transistors, respectively, the emitter collector paths of each transistor being connected in parallel with said ignition switch, the base of each transistor being controlled by said on/off switch to render said transistors conductive upon closure of said on/off switch.

4. An audio system for a motor vehicle including a battery, an ignition switch connected with said battery, said system including a source of audio signals, audio processing circuit means for processing said audio signals and providing a plurality of output signals, a plurality of enclosed speakers located remotely from said source of audio signals, each speaker enclosure containing a power amplifier responsive to one of said plurality of output signals for driving respective ones of said speakers, an on/off power switch connected in series with said ignition switch, a power relay responsive to concurrent closure of said ignition switch and said on/off power switch for connecting said battery to each of said power amplifiers, each power amplifier including filter means which delay shutdown of said power amplifier for a first predetermined time interval following opening of said on/off power switch, a first switching transistor adapted to be rendered conductive in response to concurrent closure of said ignition switch and said on/off power switch to connect said battery to said source of audio signals, second transistor switching means adapted to be rendered conductive in response to concurrent closure to said ignition switch and said on/off power switch to connect said source of direct current potential to said audio processing circuit means, time delay means for maintaining said second transistor switching means in a conductive state for a second predetermined time interval following opening of said ignition switch or said on/off power switch, said second predetermined time interval being greater than said first predetermined time interval whereby said power amplifier means is deenergized prior to said audio processing means when said ignition switch or said on/off power switch is opened to thereby eliminate audible disturbances originating as a result of shutdown of said audio processing circuit means, volume control means combined with said on/off power switch, said volume control means providing an input to said audio processing circuit means so that the amplitude of the output signals of said audio processing circuit means is at a minimum when said on/off power switch is moved to an open position.

* * * * *